United States Patent [19]

Smith et al.

[11] 4,229,974

[45] Oct. 28, 1980

[54] PETROLEUM AND SYNTHETIC GREASE THERMOPARTICULATING COATING

[75] Inventors: James D. B. Smith, Wilkins Township, Allegheny County; D. Colin Phillips, Monroeville; Kenneth W. Grossett, Murrysville Boro, all of Pa.

[73] Assignee: Westinghouse Electric Corp., Pittsburgh, Pa.

[21] Appl. No.: 956,143

[22] Filed: Oct. 27, 1978

[51] Int. Cl.$^3$ .................. G08B 21/00; G01K 11/00; G01K 13/00; G01K 1/02
[52] U.S. Cl. .................. 73/339 R; 73/28; 73/349; 252/408; 310/55; 310/56
[58] Field of Search ....... 252/408; 73/339 R, 339 TP, 73/28; 310/52, 55, 56

[56] References Cited

U.S. PATENT DOCUMENTS

| 2,671,758 | 3/1954 | Vinograd et al. .................. 252/309 |
| 3,955,417 | 5/1976 | Smith et al. .................. 73/339 R |
| 3,957,014 | 5/1976 | Phillips et al. .................. 73/339 R |
| 3,995,489 | 12/1976 | Smith et al. .................. 252/408 |
| 4,074,137 | 2/1978 | Carson et al. .................. 73/339 R |
| 4,080,535 | 3/1978 | Phillips et al. .................. 73/339 R |
| 4,142,416 | 3/1979 | Smith et al. .................. 252/408 |

OTHER PUBLICATIONS

Pietsch, H. E., et al., "Sacrificial Coatings for Improved Detection of Overheating in Generators," presented IEEE PES Winter Meeting, N.Y., N.Y. (Jan. 30–Feb. 4, 1977).

Fort, E. M., et al., "Detection and Identification of Overheated Components of Electrical Generators," IEEE-ASME Joint Power Generation Conference, Miami, Fla., (Sep. 15-19, 1974).

Carson, C. C., et al., "Immediate Warning of Local Overheating in Electrical Machines by the Detection of Pyrolysis Products," IEEE PES Summer Meeting, San Francisco, Cal. (Jul. 9-14, 1972).

Sexton, R. M., et al., "Chemical Monitoring of Hydrogen-Cooled Turbine Generators Brought up to Date," 42nd Annual Intern'l Conf. Doble Clients, Boston, Mass. (Apr. 1975).

*Primary Examiner*—Teddy S. Gron
*Attorney, Agent, or Firm*—R. D. Fuerle

[57] ABSTRACT

A petroleum or synthetic grease is used to protect electrical apparatus from overheating. The grease is applied to a portion of an electrical apparatus which is exposed to a gas stream, particularly to portions subjected to operating temperatures of about 100° C. When the coated portion of the electrical apparatus overheats the grease forms particles in the gas stream which are detected by a monitor. The apparatus can then be shut down or its load reduced.

11 Claims, No Drawings

PETROLEUM AND SYNTHETIC GREASE THERMOPARTICULATING COATING

PRIOR ART

U.S. Pat. No. 3,955,417 discloses a thermoparticulating grease for use in generators. The grease is a telomer of polytetrafluoroethylene and a perfluoroalkyl polyether.

U.S. Pat. Application Ser. No. 796,242, filed May 12, 1977, now U.S. Pat. No. 4,179,926, discloses the mixture of thermoparticulating greases with other thermoparticulating compounds for use in generators.

BACKGROUND OF THE INVENTION

Electrical apparatus, such as motors and turbine generators, occasionally overheat due to shorts or other malfunctions. The longer the overheating continues the more damage is done to the apparatus. A malfunction detected immediately may mean only a quick repair but if the overheating continues, the entire machine may be damaged.

Large rotating electrical apparatus is usually cooled with a hydrogen gas stream. The organic compounds in the apparatus are first to be affected by the overheating and they decompose to form particles which enter the gas stream. Monitors then detect particles in the gas stream and sound a warning or shut down the apparatus when too many particles are detected.

Descriptions of such monitors and how they function may be found in U.S. Pat. No. 3,427,880 titled "Overheating Detector For Gas Cooled Electrical Machine" and in U.S. Pat. No. 3,573,460 titled "Ion Chamber For Submicron Particles." Another monitor, "The Condensation Nuclei Detector," is described by F. W. Van-Luik, Jr. and R. E. Rippere in an article titled "Condensation Nuclei, A New Technique For Gas Analysis," in Analytic Chemistry 34, 1617(1962) and by G. F. Skala in an article titled "A New Instrument For the Continuous Detector Of Condensation Nuclei," in Analytical Chemistry 35, 702 (1963).

U.S. Pat. Nos. 4,056,005; 3,973,438; 3,973,439; 4,046,733; 4,056,006; 4,016,745; 3,957,014; 3,995,489; 3,979,353; 4,046,943; and 3,955,417 describe many compounds which can be applied to portions of the generator exposed to the gas stream. (Also see U.S. Pat. Nos. 3,427,880 and 3,807,218). These compounds decompose to form detectable particles (i.e., thermoparticulate) at lower temperatures than do the usual organic compounds found in the apparatus. The use of some of these compounds is limited to areas of the generator which are normally operated below 80° or even 60° C. because they are not stable at higher temperatures.

There are several areas of the generator, however, which normally operate at temperatures of about 100° C. While some compounds have been found which can withstand continuous temperatures of 100° to 130° C. over a long period and then thermoparticulate when the temperature increases to about 180° to about 200° C., there is still a need for compounds which are stable at 100° C. yet will thermoparticulate below 200° C.

SUMMARY OF THE INVENTION

We have found that a certain petroleum and synthetic greases can withstand continuous temperatures of about 100° C. to about 200° C. Moreover, these greases are able to thermoparticulate repeatedly, unlike most thermoparticulating compounds which can thermoparticulate only once. The greases of this invention, however, will thermoparticulate, cool, and thermoparticulate again when the temperature increases again. This is a useful property because should a sudden increase in temperature occur, which causes thermoparticulation but does not damage the machine enough to require a shutdown, the machine can continue to be operated with the protection offered by the coating. If another type of coating had been used, it would be necessary to shut down the machine and apply additional coating or to run the machine without the coating.

While the greases do not discolor after thermoparticulating as the other coatings do, locating the area of overheating is not considered to be a problem because the greases are applied to relatively few areas of the generator. The decomposition products can be readily identified by mass spectroscopy, nuclear magnetic resonance, or gas liquid chromatography.

The greases of this invention also have some advantages over the thermoparticulating greases disclosed in U.S. Pat. No. 3,955,417 in that they are less expensive and thermoparticulate at lower temperatures.

DESCRIPTION OF THE INVENTION

The greases of this invention are either synthetic straight chain hydrocarbons, synthetic diesters, petroleum based branched hydrocarbons, or mixtures of any of these. The greases must decompose between about 60° and about 200° C. and produce particles larger than about 25 Å in order for the particles to be detected with presently existing monitors.

The synthetic diester preferably has the general formula

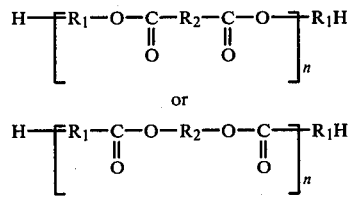

where n is an integer from 2 to 10, each $R_1$ is independently selected from

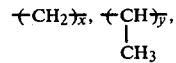

and mixtures thereof, where $x+y$ is an integer from 2 to 20, and $R_2$ is selected from

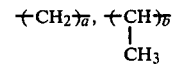

and mixtures thereof where $a+b$ is an integer from 2 to 12.

The petroleum based branched hydrocarbon is preferably either a paraffin base compound having the general formula

$C_nH_{2n+s}$ where n is an integer from 4 to 35, or a naphthene base compound having the general formula $$C_nH_{2n-x}$$

where n is an integer from 2 to 20 and x is a small number which depends upon the degree of aromaticity in the compound. Mixtures of paraffin base compounds and naphthene base compounds can also be used in said petroleum based branched hydrocarbon.

The grease preferably includes up to 25%, and preferably about 5 to 10%, of a thickener to reduce the amount of flow of the grease. (All percentages herein are by weight.) Thickeners may be of the non-soap type such as inorganic gelling material such as modified clays or they may be organic thickeners such as urea compounds. Lithium stearates, preferably lithium 12-hydroxy-stearate, are the preferred thickeners. Molybdenum disulfide, a polyurea, or polytetrafluoroethylene, can also be used as a thickener. The thickener is preferably a thixotrope so that the grease will resist flow under the pressure of the hydrogen stream in the generator.

The grease also preferably includes about 0.1 to 1 % of a rust inhibitor and up to about 2% of an antioxidant to prevent the grease from attaching metals in the generator. Suitable rust inhibitors include sodium nitrite reducing agents, lead naphthenate, and various ethylene diamine or metal sulphonates. The preferred rust inhibitor is sodium nitrite. Suitable antioxidants include diarylamines, metal dithiocarbamates, and di-substituted amines. The preferred antioxidant is phenyl alpha naphthalamine. Although not preferred, up to about 10% of a lubricant such as molybdenum disulfide can be added to the grease if desired.

The grease is applied to portions of the electrical apparatus which are exposed to the gas stream. The grease is usually applied on top of the conductor although it does not function as insulation and may be applied to insulators. This application may be by various techniques, but simply smearing the grease with a rag is adequate. Thicknesses of about ½ to about 10 mils and preferably about 2 to about 5 mils are suitable.

While the grease is most advantageously applied to those areas which are subjected to a continuous operating temperature of about 100° to about 130° C. depending on the particular grease used, they may also be applied to other areas, either along or in combination with other thermoparticulating compounds. Three areas of a generator which normally operate at temperatures of about 100° to about 130° C. are the inner surfaces of gas-cooled parallel rings and bushings, the stator core, and the rotor hollow conductors.

After thermoparticulation and the resulting alarm has occurred, a sample of the gas stream can be collected and analyzed. Since different thermoparticulating compounds can be used in different areas of the apparatus and their thermoparticulation products are different, analysis of the sample can pinpoint the location of the overheating.

The following examples further illustrate this invention:

EXAMPLE 1

Samples were prepared by smearing various greases onto 3 inch by 1 inch aluminum sheets to a thickness of about 2 to 5 mils. The samples were placed in an oven at 60° C., 80° C., 100° C., and 130° C. for various periods to determine if they were stable and would function after aging. In addition, changes in sample weight and the degree of cracking and flaking of the sample from the aluminum surface were monitored during aging.

The samples were placed one at a time in a stainless steel boat within a 1 inch stainless steel tube. Hydrogen was passed over the samples at a flow rate of 7 l/min. A phase-controlled temperature regulator and programmer controlled the temperature in the boat. The temperature in the boat was measured by mounting a hot junction chromel-alumel thermocouple within a small hole in the boat. The output of the thermocouple and the detector were monitored on a two-pen potentiostatic recorder. A 5° C./min. heating rate was maintained in each experiment after the insertion of the sample in the boat. The threshold temperature at which thermoparticulation began was taken from the chart produced by the recorder. The "alarm" temperature at which considerable particulation occurred corresponded to a 50% decrease in the initial ion current of the detector (usually 0.8 to 0.4 mA). These two temperatures enabled a "thermoparticulation temperature range" to be recorded for each sample. The occurrence of particulation was detected using a Generator Condition Monitor sold by Environment One Corporation.

The following table gives the thermoparticulating temperature ranges after aging. The aging at the higher temperatures was done after aging at the lower temperatures. The "Krytox 240-AD" grease is not within the scope of this invention (see U.S. Pat. No. 3,955,417) but is included for comparison.

| Commercial Name and Supplier | 60° C. for 1 day | 80° C. for 18 days | 100° C. for 45 days | 130° C. for 49 days |
| --- | --- | --- | --- | --- |
| Grease 28 Mobil Oil Co. | 166–171 | 163–169 | 154–159 | 173–177 |
| Beacon 325 | 165–169 | 160–165 | 158–163 | 191–198 |
| Chevron BRB2 | 169–179 | 177–181 | 172–177 | 177–183 |
| Chevron BRB2SR1 | 178–183 | 169–174 | 177–182 | 179–183 |
| Unirex N2 | 176–179 | 178–184 | 174–179 | 179–184 |
| Molykote BR2 | 173–176 | 170–180 | 165–170 | 184–190 |
| Krytox 240-AD | 192–198 | — | — | 200–207* |

*aged 84 days at 120° C.

The compositions of the greases are as follows:

Grease 28—The base oil is a synthesized hydrocarbon fluid of essentially straight chain paraffinic structure made from selected polyolefins. The thickener is a non-soap type made from two different non-soap thickener agents which are in common use. The first is an inorganic gelling material such as modified clays and the second is an organic thickener such as a urea compound.

Beacon 325—The base oil is a synthetic diester oil generally of the di(2-ethylhexyl) sebacate type. The thickener is lithium stearate, probably lithium 12-hydroxy stearate soap.

Chevron BRB2—The base oil is a solvent refined petroleum hydrocarbon. It is paraffinic of approximately 500 to 600 molecular weight, 55U at 100° F. (127SC). It includes rust and oxidation inhibitors. The thickener is a polyurea, an ashless organic compound which may be prepared by reacting an isocyanate with an amine.

Chevron BRB2SR1—This grease is essentially the same as Chevron BRB2 in formulation with the exception that additives in the form of sodium and magnesium salts are present to provide superior rust and oxidation protection. Each metal salt is present in about 0.2%. The grease also includes 8 to 9% polyurea thickener and about 85% oil as a lubricant.

Unirex N2—The base oil is solvent refined and includes rust and oxidation inhibitors. It is a petroleum hydrocarbon oil with approximately 600 SSU (129CS) at 100° F. The thickener is a lithium complex soap base. A complex soap base is defined as one in which the soap fibers are formed by co-crystallization of two compounds. Not only compositions but also processing alterations produce variations of "complex" base greases. The specific identification of the complexing agent is not known. However, the solvent most often used is calcium acetate although other salts such as chlorides, nitrates, nitrites, phosphate, and silicates may also be included.

Molykote BR2—The base oil is a petroleum hydrocarbon oil of approximately 500 SSU at 100° F. The thickener is lithium 12-hydroxy stearate soap plus approximately 10% by weight of molybdenum disulfide powder.

Krytox 240-AD—This grease is a mixture of a telomer of polytetrafluoroethylene and perfluoroalkyl polyether.

We claim:

1. A method of protecting electrical apparatus from damage due to overheating, said apparatus including a gas stream and a monitor for detecting particles in said gas stream and for emitting a signal when said particles are detected, comprising applying to said electrical apparatus at positions exposed to said gas stream a thermoparticulating grease selected from the group consisting of synthetic straight chain hydrocarbons, synthetic diesters, and mixtures thereof and detecting the particles in said gas stream formed from thermoparticulation of said grease.

2. A method according to claim 1 wherein said grease is a synthetic straight chain hydrocarbon.

3. A method according to claim 1 wherein said grease is a synthetic diester.

4. A method according to claim 3 wherein said synthetic diester has the general formula

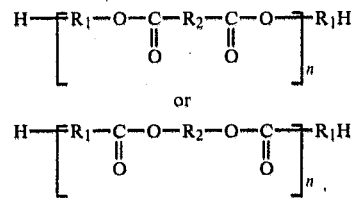

or where n is an integer from 2 to 10, each $R_1$ is independently selected from

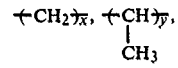

and mixtures thereof, where $x+y$ is an integer from 2 to 20, and $R_2$ is selected from

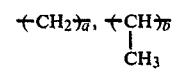

and mixtures thereof where $a+b$ is an integer from 2 to 12.

5. A method according to claim 1 wherein said grease includes up to 25% of a thickener.

6. A method according to claim 5 wherein said grease includes about 5 to about 10% of a thixotropic thickener.

7. A method according to claim 6 wherein said thixotropic thickener is a lithium stearate.

8. A method according to claim 1 wherein said grease includes about 0.1 to about 1% of a rust inhibitor.

9. A method according to claim 1 wherein said grease includes up to about 2% of an anti-oxidant.

10. A method according to claim 1 wherein said grease includes up to 10% of a lubricant.

11. A thermal detection system for electrical apparatus cooled by a gas stream, comprising a thermoparticulating coating on a portion of said electrical apparatus exposed to said gas stream and a monitor for detecting the presence of particles formed from said thermoparticulating coating in said gas stream, said thermoparticulating coating comprising a thermoparticulating grease selected from the group consisting of synthetic straight chain hydrocarbons, synthetic diesters, and mixtures thereof.

* * * * *